(12) United States Patent
Sun et al.

(10) Patent No.: US 12,041,710 B2
(45) Date of Patent: Jul. 16, 2024

(54) HEAT DISSIPATION APPARATUS, CIRCUIT BOARD, AND ELECTRONIC DEVICE

(71) Applicant: Huawei Technologies Co., Ltd., Shenzhen (CN)

(72) Inventors: Zhen Sun, Shenzhen (CN); Zhen Lu, Dongguan (CN); Yuping Hong, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 286 days.

(21) Appl. No.: 17/451,995

(22) Filed: Oct. 22, 2021

(65) Prior Publication Data

US 2022/0046783 A1  Feb. 10, 2022

Related U.S. Application Data (63) Continuation of application No. PCT/CN2019/130740, filed on Dec. 31, 2019.

(30) Foreign Application Priority Data

Apr. 25, 2019 (CN) .......................... 201910340663.0

(51) Int. Cl.
  *H05K 1/02* (2006.01)
  *H05K 7/20* (2006.01)
(52) U.S. Cl.
  CPC ....... *H05K 1/0203* (2013.01); *H05K 7/20336* (2013.01)
(58) Field of Classification Search
  CPC ............. H05K 7/20336; H05K 1/0203; H05K 1/0272; F28D 15/04; F28D 15/046; F28D 15/043; F28F 2255/18; F28F 2260/02; F28F 3/12; F28F 13/003; F28F 21/084
  See application file for complete search history.

(56) References Cited

U.S. PATENT DOCUMENTS

| | | | |
|---|---|---|---|
| 6,460,612 B1 | 10/2002 | Sehmbey et al. | |
| 6,987,318 B2 * | 1/2006 | Sung | .................. H01L 23/3733 257/E23.11 |
| 7,002,247 B2 | 2/2006 | Mok et al. | |
| 7,095,111 B2 * | 8/2006 | Hu | .......................... H01L 24/24 257/E23.101 |
| 8,074,706 B2 | 12/2011 | Su et al. | |

(Continued)

FOREIGN PATENT DOCUMENTS

| | | |
|---|---|---|
| CN | 1892165 A | 1/2007 |
| CN | 101004333 A | 7/2007 |

(Continued)

*Primary Examiner* — Adam B Dravininkas
(74) *Attorney, Agent, or Firm* — Slater Matsil, LLP (57) ABSTRACT

A heat dissipation apparatus is provided. The heat dissipation apparatus includes a thermally conductive housing. The heat dissipation apparatus is connectable to a chip so that the chip is arrangeable on a chip placement region of the thermally conductive housing. A capillary structure is disposed on the thermally conductive housing and a working medium is placed in the capillary structure. The capillary structure includes a first capillary structure and a second capillary structure that are connected, and a maximum thickness of the first capillary structure is less than a minimum thickness of the second capillary structure.

20 Claims, 5 Drawing Sheets

(56) References Cited

U.S. PATENT DOCUMENTS

| | | | |
|---|---|---|---|
| 8,813,834 B2* | 8/2014 | Chin | H01L 23/427 165/104.26 |
| 9,803,938 B2* | 10/2017 | Joshi | H01L 23/4735 |
| 2005/0155745 A1 | 7/2005 | Kawahara et al. | |
| 2006/0037737 A1 | 2/2006 | Chen et al. | |
| 2008/0283222 A1* | 11/2008 | Chang | H01L 23/427 165/104.26 |
| 2009/0097206 A1 | 4/2009 | Tomioka | |
| 2010/0139893 A1* | 6/2010 | Ding | F28D 15/046 165/104.26 |
| 2010/0155030 A1* | 6/2010 | Hwang | F28D 15/0233 165/185 |
| 2010/0294475 A1* | 11/2010 | Rush | H01L 23/427 165/185 |
| 2011/0174466 A1 | 7/2011 | Liu et al. | |
| 2015/0204617 A1 | 7/2015 | Thanhlong et al. | |
| 2020/0221605 A1* | 7/2020 | Vanderwees | B22F 7/004 |

FOREIGN PATENT DOCUMENTS

| | | |
|---|---|---|
| CN | 101232794 A | 7/2008 |
| CN | 101650142 A | 2/2010 |
| CN | 101819002 A | 9/2010 |
| CN | 101927426 A | 12/2010 |
| CN | 101929818 A | 12/2010 |
| CN | 102095323 A | 6/2011 |
| CN | 103398613 A | 11/2013 |
| CN | 106856645 A | 6/2017 |

* cited by examiner

HEAT DISSIPATION APPARATUS, CIRCUIT BOARD, AND ELECTRONIC DEVICE

CROSS-REFERENCE TO RELATED APPLICATIONS

This application is a continuation of International Application No. PCT/CN2019/130740, filed on Dec. 31, 2019, which claims priority to Chinese Patent Application No. 201910340663.0, filed on Apr. 25, 2019. The disclosures of the aforementioned applications are hereby incorporated by reference in their entireties.

TECHNICAL FIELD

This application relates to the field of communications technologies, and in particular, to a heat dissipation apparatus, a circuit board, and an electronic device.

BACKGROUND

Figure 1:
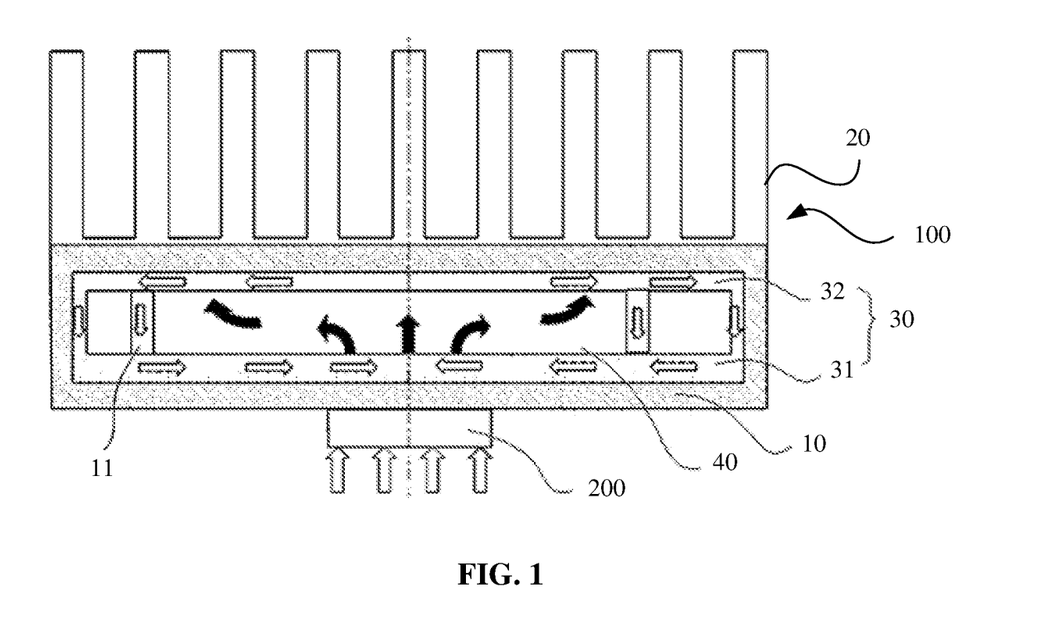
FIG. 1 is a reference structural diagram of a heat dissipation apparatus according to an embodiment.

With development of microelectronic technologies, a size of a chip becomes smaller, a computing speed becomes higher, and a heat emission amount becomes larger. For example, in the prior art, power consumption of a GPU (graphics processing unit) during running reaches 375 W. It can be predicted that in the near future, power consumption of a GPU with higher performance may exceed 500 W, and a heat dissipation requirement is increasingly high. In the prior art, a VC (vapor chamber) is used as a heat dissipation structure of a chip. This can effectively dissipate centralized heat. As shown in FIG. 1, the VC mainly includes a metal thermally conductive housing, a capillary structure, and a working fluid. A working principle of the VC is as follows: A cavity in the thermally conductive housing is vacuumed and a working medium is placed in the cavity. When heat is conducted from a heat source to an evaporation region, the working medium in the cavity starts to be gasified from a liquid phase in an environment with a low vacuum degree. In this case, the working medium absorbs the heat and rapidly expands in volume, and the entire cavity is quickly filled with the gas-phase working medium. When the gas-phase working medium moves to a relatively cold region, the gas-phase working medium condenses, so as to dissipate heat accumulated during evaporation. After the condensation, the liquid-phase working medium returns to the evaporation region for heat source due to a capillary attraction action of the capillary structure. This process is cyclically performed in the cavity, so that the heat generated by the heat source can dissipate. However, in the prior art, as a medium for transporting the working medium, a capillary wick in the VC provides a liquid return driving force, but increases liquid flow resistance. This affects a heat dissipation effect.

SUMMARY

Embodiments provide a heat dissipation apparatus, a circuit board, and an electronic device, to improve a heat dissipation effect for a chip.

According to a first embodiment, a heat dissipation apparatus is provided. The heat dissipation apparatus is configured to dissipate heat for a chip. During specific disposal, the heat dissipation apparatus includes a thermally conductive housing, the thermally conductive housing may be a metal housing, the thermally conductive housing has a first surface, and a chip placement region is disposed on the first surface. When the heat dissipation apparatus is connected to the chip, the chip is located in the chip placement region and is connected to the thermally conductive housing in a thermally conductive manner. In addition, there is a vacuum cavity in the thermally conductive housing, and a capillary structure configured to accommodate and carry a working medium is disposed in the vacuum cavity. During use, the working medium is placed in the capillary structure and can flow in the capillary structure. To improve a heat dissipation effect for the chip, when a heat dissipation structure is specifically disposed, the capillary structure includes an evaporation-side capillary structure and a condensation-side capillary structure. The evaporation-side capillary structure is on a side close to the chip, and the condensation-side capillary structure is on the other side opposite to the evaporation-side capillary structure. The evaporation-side capillary structure is divided into two connected parts: a first capillary structure and a second capillary structure, and the first capillary structure and the second capillary structure are fixedly connected to an inner wall of the thermally conductive housing. When the working medium flows, the working medium absorbs heat and evaporates after flowing from a condensation side to an evaporation side. Then, the working medium flows back to the evaporation side after condensing on the condensation side. The first capillary structure is located on the evaporation side. In other words, the first capillary structure is located on a side close to the first surface. In addition, during disposal, a vertical projection of the first capillary structure on the first surface covers at least a part of a vertical projection of the chip placement region on the first surface. In addition, when a thickness of the first capillary structure and a thickness of the second capillary structure are set, a maximum thickness of the first capillary structure is less than a minimum thickness of the second capillary structure. For the capillary structure, a thicker capillary structure can reduce flow resistance of the working medium, and a thinner capillary structure can reduce thermal resistance during evaporation. Therefore, in the foregoing structure, the thinner first capillary structure is disposed in an evaporation region, so that an evaporation effect of the working medium after heat absorption is improved. In addition, the thicker second capillary structure is used to reduce backflow resistance of the working medium. In this way, a heat transfer effect of the working medium is improved, and the heat dissipation effect for the chip is further improved.

Different structures may be used when the first capillary structure and the second capillary structure are specifically disposed. For example, in a specific implementation solution, the capillary structure is a groove structure or a pipe structure. Alternatively, the capillary structure may be a porous structure. In this case, both the first capillary structure and the second capillary structure are porous structures, and a pore of the first capillary structure is connected to a pore of the second capillary structure. In this way, the working medium is carried by using different structures.

When the porous structure is used, a diameter of the pore of the first capillary structure is less than or equal to a diameter of the pore of the second capillary structure. Therefore, the backflow resistance of the working medium can be further reduced, and the thermal resistance during evaporation can be reduced.

In a specific implementation solution, the first capillary structure and the second capillary structure are connected through sintering. A sintering manner is used for improvement.

The first capillary structure and the second capillary structure may be formed by using different structures. For example, in a specific implementation solution, both the first capillary structure and the second capillary structure are porous structures formed by sintering metal powder or a metal mesh. In other words, the capillary structure is formed by sintering the metal powder or the metal mesh. The metal may be different metals having a good thermally conductive effect, for example, different metals such as copper, aluminum, and iron. In a specific implementation solution, copper powder or a copper mesh made of copper is selected.

In a specific implementation solution, a diameter of metal powder used for the first capillary structure is less than or equal to a diameter of metal powder used for the second capillary structure. A diameter of a formed pore varies with a diameter of selected metal powder. A larger diameter of the metal powder leads to a larger diameter of the formed pore.

In a specific implementation solution, the second capillary structure is the metal mesh, and the first capillary structure is a porous structure formed by sintering the metal powder. Alternatively, the second capillary structure is a porous structure formed by sintering the metal powder, and the first capillary structure is the metal mesh. In other words, both the first capillary structure and the second capillary structure may be formed by sintering the metal powder or the metal mesh.

In a specific implementation solution, the thermally conductive housing has a second surface opposite to the first surface, the heat dissipation apparatus further includes a heat sink, and the heat sink is fastened on the second surface and is connected to the thermally conductive housing in a thermally conductive manner. The heat sink is disposed to improve the heat dissipation effect. After evaporation, the working medium transfers the heat to the heat sink for heat dissipation. The heat sink may have different structures. For example, a fin-type heat sink is used.

When the first capillary structure is specifically disposed, to improve the heat dissipation effect, an area of the vertical projection of the first capillary structure on the first surface is 70% to 130% of an area of the vertical projection of the chip placement region on the first surface. For example, a percentage may be 70%, 80%, 90%, 100%, 110%, 120%, or 130%.

In a specific implementation solution, an axis of the first capillary structure overlaps an axis of the chip placement region. In this way, the first capillary structure and the chip may correspond to each other rightly, so that the heat dissipation effect is improved.

In a specific implementation solution, the thickness of the first capillary structure is 10% to 90% of the thickness of the second capillary structure. In other words, the thickness of the first capillary structure may be different thicknesses, for example, may be 10%, 30%, 50%, 70%, 80%, or 90% of the thickness of the second capillary structure.

When the chip placement region is specifically disposed, the first capillary structure may correspond to the chip placement region in a plurality of manners. For example, there is at least one chip placement region, and the first capillary structure is in a one-to-one correspondence with the chip placement region. Alternatively, at least one chip placement region may correspond to one first capillary structure.

According to a second embodiment, a circuit board is provided. The circuit board includes a circuit board body and a chip disposed on the circuit board body, and further includes the heat dissipation apparatus according to any one of the foregoing solutions. The chip is connected to a chip placement region of the heat dissipation apparatus in a thermally conductive manner. In the foregoing structure, a thinner first capillary structure is disposed in an evaporation region, so that an evaporation effect of a working medium after heat absorption is improved. In addition, a thicker second capillary structure is used to reduce backflow resistance of the working medium. In this way, a heat transfer effect of the working medium is improved, and a heat dissipation effect for the chip is further improved.

According to a third embodiment, an electronic device is provided. The electronic device includes a housing and the circuit board disposed in the housing according to any one of the foregoing solutions. In the foregoing structure, a thinner first capillary structure is disposed in an evaporation region, so that an evaporation effect of a working medium after heat absorption is improved. In addition, a thicker second capillary structure is used to reduce backflow resistance of the working medium. In this way, a heat transfer effect of the working medium is improved, and a heat dissipation effect for a chip is further improved.

DETAILED DESCRIPTION OF ILLUSTRATIVE EMBODIMENTS

To make the objectives, technical solutions, and advantages of this application clearer, the following further describes this application in detail with reference to the accompanying drawings.

To understand a heat dissipation apparatus provided in an embodiment of this application, an application scenario of the heat dissipation apparatus is first described. As shown in FIG. 1, the heat dissipation apparatus wo is configured to dissipate heat for a chip 200. During use, the heat dissipation apparatus 100 and the chip 200 are bonded together and connected in a thermally conductive manner, so that heat generated by the chip 200 is dissipated by using the heat dissipation apparatus 100.

The heat dissipation apparatus wo provided in this embodiment of this application dissipates heat for the chip 200 through a phase change of a working medium. For ease of understanding, a working principle of the heat dissipation apparatus 100 is first described. As shown in FIG. 1, the heat dissipation apparatus wo mainly includes a thermally conductive housing 10, a capillary structure 30, and the working medium. A structure shown in FIG. 1 is a sectional view of the heat dissipation apparatus 100. However, the thermally conductive housing 10 has a cuboid structure, and includes two slabs disposed opposite to each other. The two slabs are connected in a sealed manner to form a cuboid vacuum cavity 40. In addition, the chip 200 and a heat sink 20 are respectively disposed on the two opposite slabs of the thermally conductive housing 10. During heat dissipation for the chip, heat of the chip needs to be transferred to the heat sink 20 for heat dissipation. Therefore, the capillary structure 30 is disposed in the vacuum cavity 40 in the heat dissipation apparatus 100. When the capillary structure is specifically disposed, the capillary structure mainly includes two parts: a condensation-side capillary structure attached to a slab close to the heat sink 20, and an evaporation-side capillary structure attached to a slab close to the chip. In addition, the evaporation-side capillary structure is connected to the condensation-side capillary structure. During specific connection, as shown in FIG. 1, the evaporation-side capillary structure may be connected to the condensation-side capillary structure by disposing a capillary structure on a side wall connecting the two slabs. Alternatively, the evaporation-side capillary structure may be connected to the condensation-side capillary structure by disposing a support column 11 between the two slabs and disposing a capillary structure on the support column 11. The working medium is placed in the foregoing capillary structure, and the heat of the chip is transferred to the heat sink 20 by using the working medium. A working principle thereof is as follows: When the heat is conducted from the chip 200 (a heat source) to the evaporation-side capillary structure 31 through the thermally conductive housing 10, the working medium in the evaporation-side capillary structure 31 starts to be gasified from a liquid phase (as shown by black arrows) in an environment with a low vacuum degree. In this case, the working medium absorbs the heat and rapidly expands in volume, and the entire vacuum cavity 40 is quickly filled with the gas-phase working medium. When the gas-phase working medium moves to a relatively cold region (the condensation-side capillary structure 32), the gas-phase working medium condenses, so as to dissipate heat accumulated during evaporation. After the condensation, the liquid-phase working medium enters the condensation-side capillary structure 32 due to a capillary attraction action of the capillary structure, and then flows from the condensation-side capillary structure 32 back to the evaporation-side capillary structure 31 (as shown by white arrows). This process is cyclically performed in the vacuum cavity 40, so that the heat generated by the chip 200 can dissipate. The working medium may be water, kerosene, or another medium that changes in phase after heat absorption. However, regardless of a specific working medium, during use, the working medium is affected by a specific structure of the capillary structure during evaporation and backflow. Therefore, an embodiment of this application provides a new heat dissipation apparatus 100. The following describes the new heat dissipation apparatus 100 in detail with reference to specific accompanying drawings.

Figure 2:
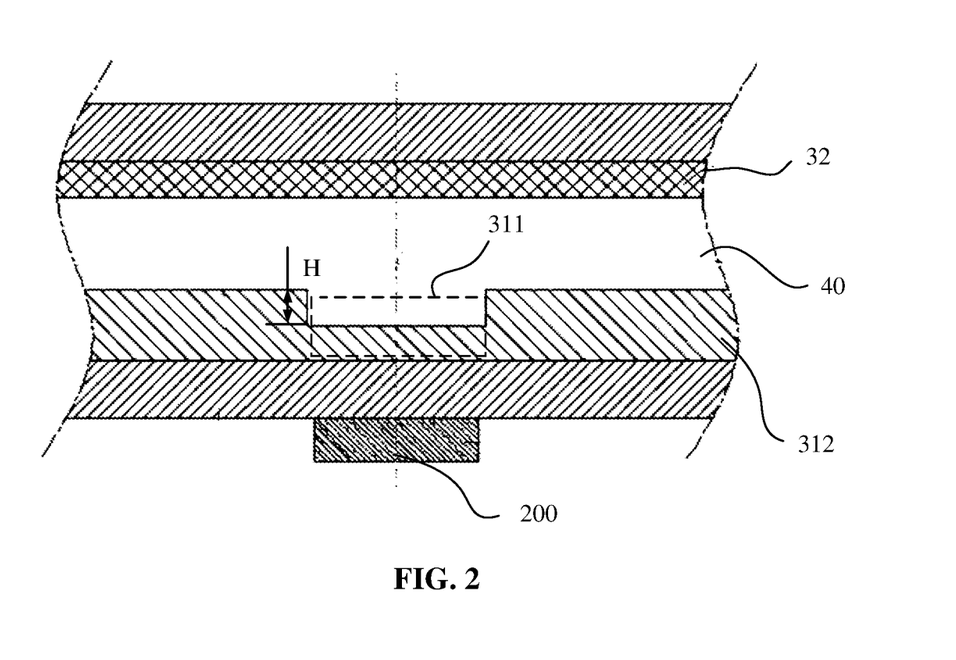
FIG. 2 is a schematic diagram of a capillary structure according to an embodiment.

Referring to both FIG. 1 and FIG. 2, a heat dissipation structure 20 provided in this embodiment of this application includes a thermally conductive housing 10. The thermally conductive housing 10 is a housing made of a thermally conductive material. The thermally conductive material may be a metal material, such as copper, aluminum, or another metal material that can conduct heat. Certainly, the thermally conductive housing 10 may alternatively be made of another material.

When the thermally conductive housing 10 is specifically disposed, as shown in FIG. 1 and FIG. 2, the thermally conductive housing 10 is a rectangular housing, and the housing has two opposite surfaces, which are defined as a first surface and a second surface for ease of description. A chip placement region is disposed on the first surface. When the heat dissipation apparatus is assembled with the chip 200, the chip 200 is fastened in the chip placement region and is connected to the thermally conductive housing 10 in a thermally conductive manner. During specific connection, the chip 200 may be attached to the thermally conductive housing 10 by using a thermally conductive adhesive or directly. When the chip placement region is specifically disposed, the chip placement region is a surface in a partial region on the first surface. When the first surface is specifically disposed, the first surface may be a plane, a partially convex surface, or a partially concave surface. When the chip placement region is disposed, the chip placement region may be a concave part of the first surface or a convex part of the first surface. In addition, a quantity of chip placement regions may be set as required. When there is a plurality of (two or more) chips 200, the chip placement regions may be in a one-to-one correspondence with the chips, or the plurality of chips may be disposed in one chip placement region. This may be specifically set as required.

Figure 4:
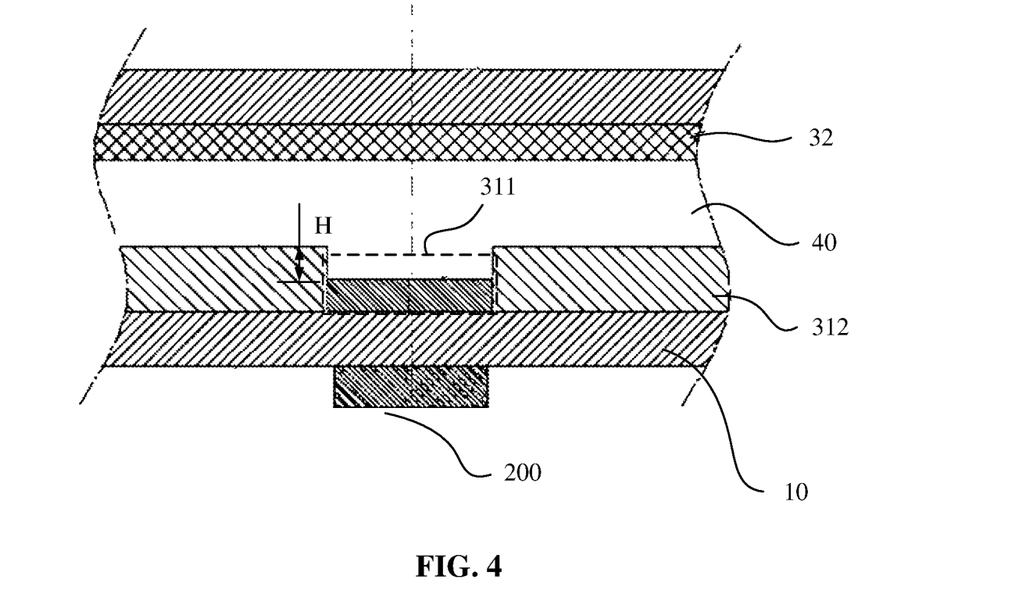
FIG. 4 is a schematic diagram of a capillary structure according to an embodiment.
Figure 5:
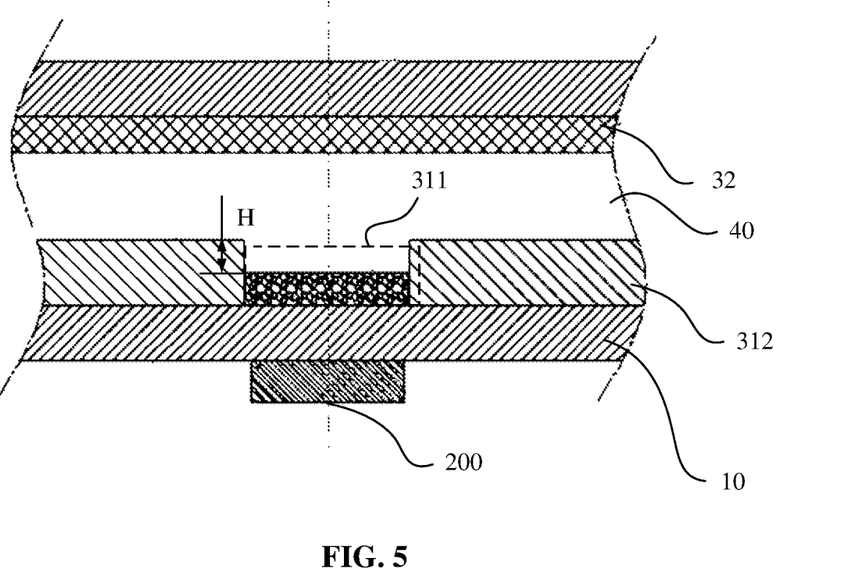
FIG. 5 is a schematic diagram of a capillary structure according to an embodiment.

Still referring to FIG. 1 and FIG. 2, there is a vacuum cavity 40 in the housing, and the vacuum cavity 40 is an accommodation cavity for accommodating a working medium and a capillary structure 30 of the heat dissipation apparatus. The capillary structure 30 is a structure for carrying the working medium, and the working medium may be placed in the capillary structure 30. During specific disposal, the capillary structure 30 is attached to an inner wall of the thermally conductive housing 10. In addition, to improve a heat dissipation effect of the heat dissipation apparatus, when the capillary structure 30 is disposed, as shown in FIG. 2, an evaporation-side capillary structure 31 in the capillary structure 30 is divided into two parts, which are named as a first capillary structure 311 and a second capillary structure 312 for ease of description. The first capillary structure 311 is connected to the second capillary structure 312. In addition, the first capillary structure 311 and the second capillary structure 312 are fixedly connected to the inner wall of the thermally conductive housing 10, and the second capillary structure 312 is divided and arranged on two sides of the first capillary structure 311. When the working medium flows, the working medium absorbs heat and evaporates after flowing from a condensation-side capillary structure 32 to the evaporation-side capillary structure 31. Then, the working medium flows back to the second capillary structure 312 and the first capillary structure 311 after condensing in the condensation-side capillary structure 32. A vertical projection of the first capillary structure 311 on the first surface of the housing 10 covers at least a part of the chip placement region. In structures shown in FIG. 2, FIG. 4, and FIG. 5, the vertical projection of the first capillary structure 311 on the first surface completely overlaps the chip placement region. However, it should be understood that FIG. 2, FIG. 4, and FIG. 5 show only one specific case, and the vertical projection of the first capillary structure 311 on the first surface may partially or completely cover the chip placement region in this embodiment of this application. "Completely cover" includes: an area of the vertical projection of the first capillary structure 311 on the first surface is greater than or equal to an area of the chip placement region. For example, when the first capillary structure 311 is specifically disposed, the area of the vertical projection of the first capillary structure 311 on the first surface is 70% to 130% of an area of a vertical projection of the chip placement region on the first surface. For example, an area percentage may be any percentage within a range from 70% to 130%, such as 70%, 80%, 90%, 100%, 110%, 120%, or 130%. In addition, when the first capillary structure 311 is specifically disposed, the projection of the first capillary structure 311 on the first surface overlaps an axis of the chip placement region. As shown in FIG. 1, an axis of the first capillary structure 311 is a center line in a thickness direction of the first capillary structure 311, and the axis of the chip placement region is a center axis perpendicular to a plane of the chip placement region. When the center line overlaps the center axis, the first capillary structure 311 and the chip 200 may have a same center, so that a heat dissipation effect is improved.

In addition, still referring to FIG. 2, when the first capillary structure 311 and the second capillary structure 312 are specifically disposed, a maximum thickness of the first capillary structure 311 is less than a minimum thickness of the second capillary structure 312. The first capillary structure 311 and the second capillary structure 312 each may be an equal-thickness capillary structure or an unequal-thickness capillary structure. For example, the first capillary structure 311 is a capillary structure whose thickness gradually changes, and the second capillary structure 312 is an equal-thickness capillary structure. Alternatively, the first capillary structure 311 is an equal-thickness capillary structure, and the second capillary structure 312 is an unequal-thickness capillary structure. Alternatively, both the first capillary structure 311 and the second capillary structure 312 may be unequal-thickness capillary structures. When the first capillary structure 311 and the second capillary structure 312 are unequal-thickness structures, the first capillary structure 311 and the second capillary structure 312 each may have different cases, for example, a case in which a thickness gradually decreases, a case in which a thickness gradually increases, and a case in which a thickness first increases and then decreases periodically. However, regardless of a specific case, the maximum thickness of the first capillary structure 311 is less than the minimum thickness of the second capillary structure 312. The following describes the first capillary structure 311 and the second capillary structure 312 by using the first capillary structure 311 and the second capillary structure 312 as examples.

As shown in FIG. 2, both the first capillary structure 311 and the second capillary structure 312 shown in FIG. 2 are equal-thickness structures. In addition, a thickness of the second capillary structure 312 is greater than a thickness of the first capillary structure 311 by H (H is a positive integer) millimeters. For the capillary structure 30, a thicker capillary structure 30 can reduce flow resistance of the working medium, and a thinner capillary structure 30 can reduce thermal resistance during evaporation. It can be learned from the foregoing description that a region above the chip placement region is a region in which the chip 200 transfers heat to the working medium. Therefore, a corresponding part of the capillary structure 30 is thinner, so as to reduce thermal resistance during evaporation. In other words, the first capillary structure 311 needs to have a smaller thickness. The evaporation-side capillary structure 31 around the above region (which is an "above region" in terms of coordinates in the figure, and does not represent a placement direction of the chip and the heat dissipation apparatus during manufacture, transportation, and use) of the chip placement region is a region to which the liquid-phase working medium flows back. To be specific, a thickness of the capillary structure 30 needs to be increased in a region corresponding to the second capillary structure 312, to reduce flow resistance of the working medium, so that the working medium flows back to the first capillary structure 311 through the thicker second capillary structure 312. Then, the working medium quickly evaporates through the thinner first capillary structure 311 for heat dissipation, so as to improve heat conduction efficiency. Although FIG. 2 shows that the thickness of the second capillary structure 312 is greater than the thickness of the first capillary structure 311 by H millimeters, when the first capillary structure 311 and the second capillary structure 312 are specifically disposed, the thickness of the first capillary structure 311 falls within a range from 10% to 90% of the thickness of the second capillary structure 312. For example, the thickness of the first capillary structure 311 may be any thickness such as 10%, 30%, 50%, 70%, 80%, or 90% of the thickness of the second capillary structure 312.

Figure 3:
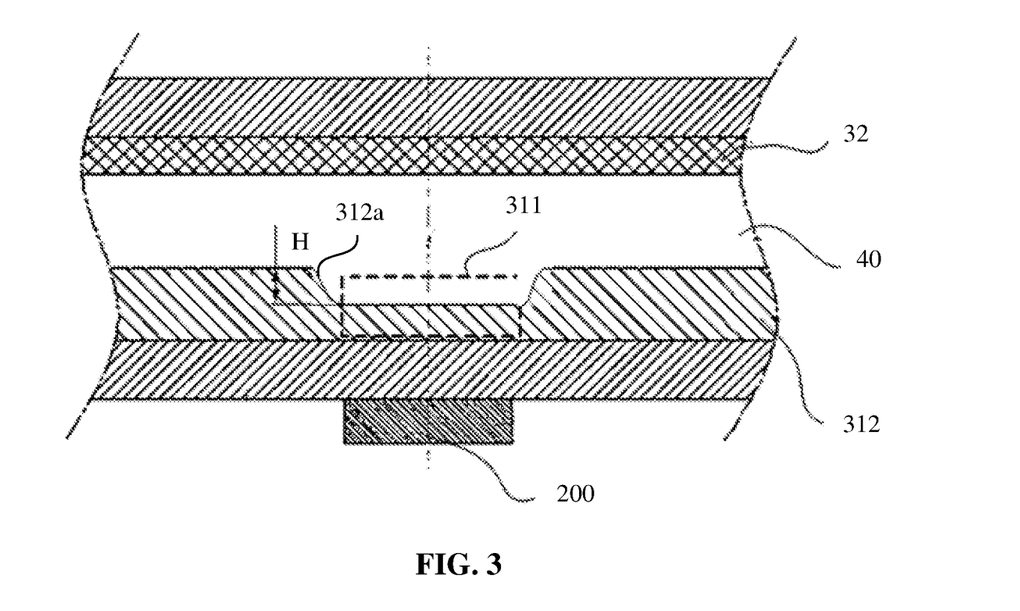
FIG. 3 is a schematic diagram of a capillary structure according to an embodiment.

In addition, although FIG. 2 shows that a connection part between the first capillary structure 311 and the second capillary structure 312 is a vertical side wall, during actual disposal, as shown in FIG. 3, there may be a transition part 312a between the first capillary structure 311 and the second capillary structure 312. For example, the thickness of the second capillary structure 312 gradually decreases to the thickness of the first capillary structure 311. In FIG. 3, the transition part 312a between the first capillary structure 311 and the second capillary structure 312 is a wave surface. Certainly, the transition part 312a may alternatively be a different surface such as an inclined surface or a stepped surface.

When the capillary structure 30 is specifically disposed, different structures may be used. For example, the capillary structure 30 is a groove structure or a pipe structure. Alternatively, the capillary structure 30 is a porous structure. All parts of the capillary structure 30 may have a same structure or different structures. For example, a part of the capillary structure 30 has a groove structure, and the other part has a pipe structure. Alternatively, the first capillary structure 311 may be disposed as a structure different from the second capillary structure 312. For ease of understanding, the following provides a description by using an example in which both the first capillary structure 311 and the second capillary structure 312 are porous structures. A pore of the first capillary structure 311 is connected to a pore of the second capillary structure 312.

When the first capillary structure 311 and the second capillary structure 312 are porous structures, the pore of the first capillary structure 311 and the pore of the second capillary structure 312 may be pores with a same diameter, or may be pores with different diameters. For pores with different diameters, a diameter of the pore of the first capillary structure 311 is less than or equal to a diameter of the pore of the second capillary structure 312, so that resistance generated when the liquid-phase working medium flows in the second capillary structure 312 can be reduced, in other words, backflow resistance of the working medium can be reduced. In addition, when the diameter of the pore of the first capillary structure 311 is relatively small, a capillary force of the capillary structure 30 increases, and a backflow driving force for the working medium increases.

When the first capillary structure 311 and the second capillary structure 312 are specifically disposed, different materials may be used to form porous structures. For example, the first capillary structure 311 and the second capillary structure 312 each are a porous structure formed by sintering metal powder or a metal mesh. For example, the first capillary structure 311 is obtained by sintering metal powder, to form a porous structure, and the second capillary structure 312 is obtained by sintering a metal mesh, to form the capillary structure 30. Alternatively, the first capillary structure 311 is obtained by sintering a metal mesh, to form the capillary structure 30, and the second capillary structure 312 is obtained by sintering metal powder, to form the capillary structure 30. Alternatively, both the first capillary structure 311 and the second capillary structure 312 may be obtained by sintering metal powder, to form the capillary structure 30. Alternatively, both the first capillary structure 311 and the second capillary structure 312 are obtained by sintering a metal mesh, to form the capillary structure. When the metal mesh is used to form the capillary structure, the metal mesh is woven by using a metal wire, and has a porous structure. A single-layer or multi-layer mesh is welded to a wall, to form the capillary structure having a same internal part. However, regardless of whether the first capillary structure 311 and the second capillary structure 312 are made of the metal powder or metal mesh, the metal powder or metal mesh is a metal or an alloy having a good thermally conductive effect, or another material having high thermally conductive performance, for example, different metals such as copper, aluminum, and iron. In specific implementation, for example, copper powder or a copper mesh made of copper is selected to make the first capillary structure 311 and the second capillary structure 312. To facilitate understanding of the capillary structure 30 provided in this embodiment of this application, the following separately describes the capillary structure 30.

First, referring to FIG. 2, the first capillary structure 311 and the second capillary structure 312 are made of a same material, for example, by sintering metal powder or a metal mesh. When the first capillary structure 311 and the second capillary structure 312 are made of the metal powder, the first capillary structure 311 and the second capillary structure 312 use a same pore diameter, to form the capillary structure 30. In this case, the first capillary structure 311 and the second capillary structure 312 are made of metal powder with a same diameter. In other words, a diameter of metal powder used for the first capillary structure 311 is equal to a diameter of metal powder (in a spherical shape) used for the second capillary structure 312. During sintering, because diameters of the used metal powder are the same, diameters of pores of the first capillary structure 311 and the second capillary structure 312 that are formed through sintering are equal. For ease of understanding, the diameter of the metal powder is defined. The metal powder is usually spherical metal powder. When the metal powder is in another shape, for example, a cuboid or a cylinder, the diameter of the metal powder is a maximum width of the metal powder.

As shown in FIG. 4, the first capillary structure 311 and the second capillary structure 312 are made of a same material. For example, both the first capillary structure 311 and the second capillary structure 312 are obtained by sintering metal powder, to form the capillary structure 30. Alternatively, both the first capillary structure 311 and the second capillary structure 312 are obtained by sintering a metal mesh, to form the capillary structure 30. When the first capillary structure 311 and the second capillary structure 312 are made of the metal powder, diameters of pores of the first capillary structure 311 and the second capillary structure 312 are different, and a diameter of a pore of the first capillary structure 311 is less than a diameter of a pore of the second capillary structure 312. During specific manufacture, a diameter of metal powder used for the first capillary structure 311 is less than a diameter of metal powder used for the second capillary structure 312. Therefore, when the first capillary structure 311 and the second capillary structure 312 are formed through sintering, because the diameter of the metal powder used for the first capillary structure 311 is smaller, a pore of a porous structure formed through sintering is smaller, and because the diameter of the metal powder used for the corresponding second capillary structure 312 is larger, a diameter of a pore formed during sintering is larger. In addition, a larger pore diameter can help increase a backflow speed of the working medium, so that a heat dissipation effect of the entire heat dissipation apparatus is improved.

As shown in FIG. 5, in a structure shown in FIG. 5, the first capillary structure 311 and the second capillary structure 312 are made of different materials. Specifically, the first capillary structure 311 is a porous structure made of a metal mesh, and the second capillary structure 312 is a porous structure formed by sintering metal powder. In addition, when the first capillary structure 311 and the second capillary structure 312 are connected, the first capillary structure 311 and the second capillary structure 312 are directly connected through sintering. Certainly, FIG. 5 shows only one specific case. When the first capillary structure 311 and the second capillary structure 312 are made of different materials, the second capillary structure 312 may alternatively be a porous structure formed by sintering a metal mesh, and the first capillary structure 311 may alternatively be a porous structure formed by sintering metal powder. A principle thereof is the same as the foregoing principle.

In addition, all parts inside the first capillary structure 311 or the second capillary structure 312 may be made of a same material, or may be made of different materials. For example, a part of the first capillary structure 311 is formed by sintering metal powder, and the other part is formed by sintering a metal mesh. It can be learned from the foregoing descriptions that the first capillary structure 311 and the second capillary structure 312 provided in this embodiment of this application may be made of different materials, and both can implement an effect of carrying the working medium.

In addition, it should be understood that, although the foregoing description is provided by using an example in which the first capillary structure 311 and the second capillary structure 312 are porous structures, in this embodiment of this application, the first capillary structure 311 and the second capillary structure 312 may alternatively be groove structures, pipe structures, or similar structures.

Still referring to FIG. 1, when the thermally conductive housing 10 is specifically disposed, the thermally conductive housing 10 has a second surface opposite to the first surface, and the second surface corresponds to the condensation-side capillary structure 32. During use, a heat sink 20 is disposed on the second surface, and the heat sink 20 is connected to the thermally conductive housing 10 in a thermally conductive manner. In this way, the heat sink 20 can dissipate heat in the working medium, so that the working medium condenses and flows back to the first capillary structure 311 through the second capillary structure 312. When the heat sink 20 is specifically disposed, the heat sink 20 may be fixedly connected to the thermally conductive housing 10 in a bonding or welding manner. In addition, during disposal, as shown in FIG. 1, the heat sink 20 is a fin-type heat sink 20. Certainly, another type of heat sink 20 may alternatively be used. This is not limited herein.

It can be learned from the foregoing description that the thinner first capillary structure 311 is disposed in an evaporation region, so that an evaporation effect of the working medium after heat absorption is improved. In addition, the thicker second capillary structure 312 is used to reduce backflow resistance of the working medium. In this way, a heat transfer effect of the working medium is improved, and a heat dissipation effect for the chip 200 is further improved.

Figure 6:
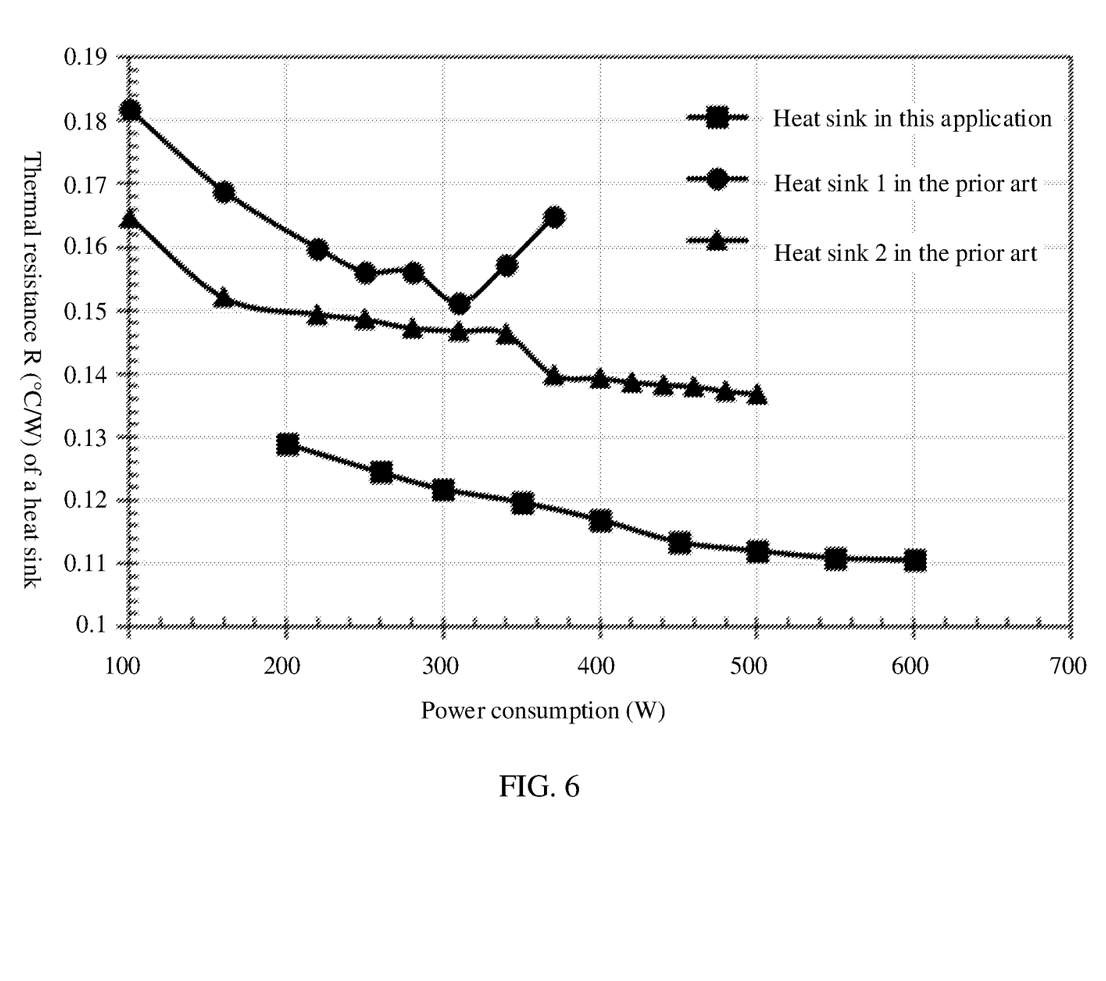
FIG. 6 is a diagram of effect comparison between a heat dissipation apparatus according to an embodiment and a heat sink in the prior art.

To facilitate understanding of an effect of a heat dissipation structure provided in the embodiments of this application, the heat dissipation structure is compared with two heat dissipation apparatuses in the prior art. As shown in FIG. 6, thermal resistance of the heat dissipation apparatus provided in the embodiments of this application is far lower than that of the heat dissipation apparatuses in the prior art.

Figure 7:
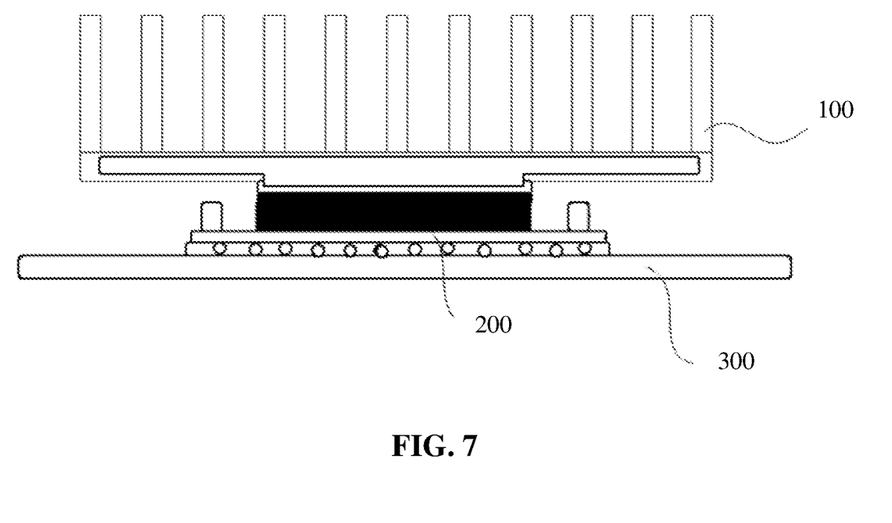
FIG. 7 is a schematic structural diagram of a circuit board according to an embodiment.

In addition, an embodiment of this application further provides a circuit board. As shown in FIG. 7, the circuit board includes a circuit board body 300 and a chip 200 disposed on the circuit board body 300, and further includes the above mentioned heat dissipation apparatus 100. The chip 200 is disposed in a chip placement region of the heat dissipation apparatus 100, and the chip 200 is connected to the chip placement region of the heat dissipation apparatus wo in a thermally conductive manner. In the foregoing structure, a thinner first capillary structure 311 is disposed at a position corresponding to the chip 200, so that a working medium in the first capillary structure 311 evaporates as soon as possible after absorbing heat. In addition, a thicker second capillary structure 312 is used to reduce backflow resistance of the working medium. In this way, a heat transfer effect of the working medium is improved, and a heat dissipation effect for the chip 200 is further improved.

Figure 8:
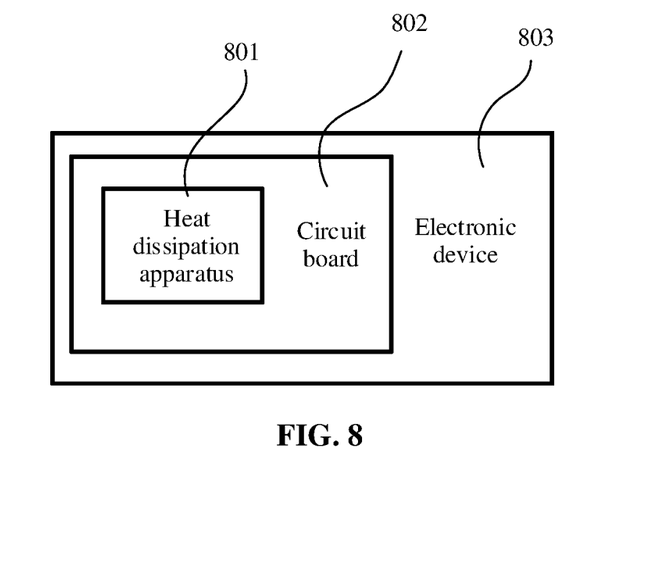
FIG. 8 is a schematic structural diagram of an electronic device according to an embodiment.

In addition, an embodiment of this application further provides an electronic device. As shown in FIG. 8, the electronic device may be a common device such as a computer, a cabinet, or a communications device. The electronic device includes a housing and the above mentioned circuit board disposed in the housing. During disposal, as shown in FIG. 8, the electronic device 803 includes the above mentioned circuit board 802, and the circuit board 802 includes the above mentioned heat dissipation apparatus 801. In addition, the heat dissipation apparatus 801 is disposed to improve a heat dissipation effect for a chip on the circuit board 802, so as to improve a running environment of the chip in the electronic device 803, and further improve working efficiency of the electronic device.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A heat dissipation apparatus comprising:
  a thermally conductive housing comprising:
    a vacuum cavity in the thermally conductive housing;
    a chip placement region on a first surface of the thermally conductive housing;
    a condensation-side capillary structure connected to a first inner wall of the thermally conductive housing;
    an evaporation-side capillary structure comprising a first capillary structure connected to a second capillary structure,
    wherein the first capillary structure and the second capillary structure are fixedly connected to a second inner wall of the thermally conductive housing,
    wherein the first inner wall is opposite to the second inner wall,
    wherein the condensation-side capillary structure and the evaporation-side capillary structure are spaced apart,
    wherein the first capillary structure is located on a side close to the first surface,
    wherein a vertical projection of the first capillary structure on the first surface covering at least a part of a vertical projection of the chip placement region on the first surface, and
    wherein a maximum thickness of the first capillary structure is less than a minimum thickness of the second capillary structure; and
  a working medium placed in the evaporation-side capillary structure.

2. The heat dissipation apparatus according to claim 1, wherein the first capillary structure and the second capillary structure are porous structures, and wherein a pore of the first capillary structure is connected to a pore of the second capillary structure.

3. The heat dissipation apparatus according to claim 2, wherein a diameter of the pore of the first capillary structure is less than or equal to a diameter of the pore of the second capillary structure.

4. The heat dissipation apparatus according to claim 3, wherein the first capillary structure and the second capillary structure are connected through sintering.

5. The heat dissipation apparatus according to claim 4, wherein the porous structures are formed by sintering metal powder or a metal mesh.

6. The heat dissipation apparatus according to claim 5, wherein a diameter of metal powder used for the first capillary structure is less than or equal to a diameter of metal powder used for the second capillary structure.

7. The heat dissipation apparatus according to claim 5, wherein the second capillary structure is the metal mesh and the first capillary structure is a porous structure formed by sintering the metal powder, or wherein the second capillary structure is a porous structure formed by sintering the metal powder and the first capillary structure is the metal mesh.

8. The heat dissipation apparatus according to claim 1, further comprising a heat sink, wherein the thermally conductive housing has a second surface opposite to the first surface, and wherein the heat sink is fastened on the second surface and is connected to the thermally conductive housing in a thermally conductive manner.

9. The heat dissipation apparatus according to claim 1, wherein an area of the vertical projection of the first capillary structure on the first surface is 70% to 130% of an area of the vertical projection of the chip placement region on the first surface.

10. The heat dissipation apparatus according to claim 1, wherein a thickness of the first capillary structure is 10% to 90% of a thickness of the second capillary structure.

11. The heat dissipation apparatus according to any one of claim 1, wherein there is at least one chip placement region and at least one first capillary structure, and wherein the first capillary structure is in a one-to-one correspondence with the chip placement region.

12. An electronic device comprising:
  an electronic device housing;
  a circuit board disposed in the electronic device housing, wherein the circuit board comprises a circuit board body and a chip disposed on the circuit board body; and
  a heat dissipation apparatus, wherein the chip is connected to a chip placement region of the heat dissipation apparatus in a thermally conductive manner, the heat dissipation apparatus comprising:

a thermally conductive housing comprising:
- a vacuum cavity in the thermally conductive housing;
- the chip placement region on a first surface of the thermally conductive housing;
- a condensation-side capillary structure connected to a first inner wall of the thermally conductive housing;
- an evaporation-side capillary structure comprising a first capillary structure connected to a second capillary structure,
- wherein the first capillary structure and the second capillary structure are fixedly connected to a second inner wall of the thermally conductive housing,
- wherein the first inner wall is opposite to the second inner wall,
- wherein the condensation-side capillary structure and the evaporation-side capillary structure are spaced apart,
- wherein the first capillary structure is located on a side close to the first surface,
- wherein a vertical projection of the first capillary structure on the first surface covers at least a part of a vertical projection of the chip placement region on the first surface, and wherein a maximum thickness of the first capillary structure is less than a minimum thickness of the second capillary structure; and
- a working medium placed in the evaporation-side capillary structure.

13. The electronic device according to claim 12, wherein the first capillary structure and the second capillary structure are porous structures, and wherein a pore of the first capillary structure is connected to a pore of the second capillary structure.

14. The electronic device according to claim 13, wherein a diameter of the pore of the first capillary structure is less than or equal to a diameter of the pore of the second capillary structure.

15. The electronic device according to claim 14, wherein the first capillary structure and the second capillary structure are connected through sintering.

16. The electronic device according to claim 15, wherein the porous structures are formed by sintering metal powder or a metal mesh.

17. The electronic device according to claim 16, wherein a diameter of metal powder used for the first capillary structure is less than or equal to a diameter of metal powder used for the second capillary structure.

18. The electronic device according to claim 16, wherein the second capillary structure is the metal mesh and the first capillary structure is a porous structure formed by sintering the metal powder, or wherein the second capillary structure is a porous structure formed by sintering the metal powder and the first capillary structure is the metal mesh.

19. The electronic device according to claim 12,
- wherein the thermally conductive housing has a second surface opposite to the first surface,
- wherein the heat dissipation apparatus further comprises a heat sink, and
- wherein the heat sink is fastened on the second surface and is connected to the thermally conductive housing in a thermally conductive manner.

20. The electronic device according to claim 12, wherein an area of the vertical projection of the first capillary structure on the first surface is 70% to 130% of an area of the vertical projection of the chip placement region on the first surface.

* * * * *

UNITED STATES PATENT AND TRADEMARK OFFICE
CERTIFICATE OF CORRECTION

| | |
|---|---|
| PATENT NO. | : 12,041,710 B2 |
| APPLICATION NO. | : 17/451995 |
| DATED | : July 16, 2024 |
| INVENTOR(S) | : Sun et al. |

It is certified that error appears in the above-identified patent and that said Letters Patent is hereby corrected as shown below:

In the Claims

In Column 12, in Claim 11, Line 54, delete "to any one of" and insert -- to --.

Signed and Sealed this
Third Day of September, 2024

*Katherine Kelly Vidal*

Katherine Kelly Vidal
*Director of the United States Patent and Trademark Office*